(12) United States Patent
Mori et al.

(10) Patent No.: US 11,787,724 B2
(45) Date of Patent: Oct. 17, 2023

(54) METHOD FOR PRODUCING GLASS FILM

(71) Applicant: Nippon Electric Glass Co., Ltd., Shiga (JP)

(72) Inventors: Hiroki Mori, Shiga (JP); Koichi Mori, Shiga (JP); Takuya Shioji, Shiga (JP); Toshitaka Nishijima, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 329 days.

(21) Appl. No.: 16/329,819

(22) PCT Filed: Sep. 21, 2017

(86) PCT No.: PCT/JP2017/034131
§ 371 (c)(1),
(2) Date: Mar. 1, 2019

(87) PCT Pub. No.: WO2018/070207
PCT Pub. Date: Apr. 19, 2018

(65) Prior Publication Data
US 2019/0218132 A1 Jul. 18, 2019

(30) Foreign Application Priority Data
Oct. 11, 2016 (JP) .................................. 2016-200021

(51) Int. Cl.
*C03B 35/16* (2006.01)
*B65G 49/06* (2006.01)
*C03B 17/06* (2006.01)
*C03B 35/18* (2006.01)
(Continued)

(52) U.S. Cl.
CPC ............ *C03B 35/161* (2013.01); *B65G 49/06* (2013.01); *B65G 49/065* (2013.01);
(Continued)

(58) Field of Classification Search
CPC .. C03B 35/161; C03B 33/023; C03B 33/0235
See application file for complete search history.

(56) References Cited

U.S. PATENT DOCUMENTS

2009/0107182 A1 4/2009 Anderson et al.
2011/0177325 A1 7/2011 Tomamoto et al.
(Continued)

FOREIGN PATENT DOCUMENTS

JP 2010-132531 6/2010
JP 2014-189483 10/2014
(Continued)

OTHER PUBLICATIONS

Notice of Reasons for Refusal dated Apr. 14, 2020 in counterpart Japanese Patent Application No. 2016-200021 with English translation.
(Continued)

*Primary Examiner* — Lisa L Herring
(74) *Attorney, Agent, or Firm* — Wenderoth, Lind & Ponack, L.L.P.

(57) ABSTRACT

A method of manufacturing a glass film includes a forming step of forming a band-shaped glass film by pulling down a glass ribbon flowing down from a forming trough while sandwiching the glass ribbon from both front and back sides through use of roller pairs and a conveyance direction changing step of changing a conveyance direction of the glass film from the vertical direction to the horizontal direction by conveying the glass film along a conveyance path having an arc shape while supporting the glass film from a back surface side with a roller conveyor so that a front surface of the glass film after having passed through the conveyance path faces upward. A first roller to be brought into abutment against the glass film from the front
(Continued)

surface side is arranged between a roller pair arranged in a lowermost stage and the roller conveyor.

8 Claims, 5 Drawing Sheets

(51) Int. Cl.
*C03B 33/09* (2006.01)
*C03B 33/023* (2006.01)
*H01L 21/677* (2006.01)
*C03C 17/06* (2006.01)

(52) U.S. Cl.
CPC ........ *C03B 17/068* (2013.01); *C03B 33/0235* (2013.01); *C03B 33/091* (2013.01); *C03B 35/18* (2013.01); *C03B 35/182* (2013.01); *C03C 17/06* (2013.01); *H01L 21/67718* (2013.01)

(56) References Cited

U.S. PATENT DOCUMENTS

| | | | |
|---|---|---|---|
| 2012/0090357 A1* | 4/2012 | Nakamura | C03B 17/067 65/95 |
| 2014/0075994 A1* | 3/2014 | Anderson | C03B 13/16 65/29.11 |
| 2014/0137602 A1* | 5/2014 | Tamamura | C03B 35/166 65/94 |
| 2016/0168003 A1* | 6/2016 | Hasegawa | C03B 33/091 65/105 |

FOREIGN PATENT DOCUMENTS

| | | | | |
|---|---|---|---|---|
| JP | 2016-50147 | | 4/2016 | |
| KR | 10-2010-0092462 | | 8/2010 | |
| WO | WO-2006121709 A1 * | | 11/2006 | ........... C03B 35/185 |
| WO | 2009/058293 | | 5/2009 | |
| WO | 2013/099676 | | 7/2013 | |
| WO | WO-2014051984 A1 * | | 4/2014 | ........... C03B 17/064 |
| WO | WO-2015029888 A1 * | | 3/2015 | ........... C03B 33/091 |
| WO | 2016/104400 | | 6/2016 | |

OTHER PUBLICATIONS

International Preliminary Report on Patentablility dated Apr. 16, 2019 in International (PCT) Patent Application No. PCT/JP2017/034131.

Office Action dated May 21, 2021 in corresponding Korean Patent Application No. 10-2018-7032154, with English-language translation.

International Search Report dated Nov. 21, 2017 in International (PCT) Application No. PCT/JP2017/034131.

* cited by examiner

METHOD FOR PRODUCING GLASS FILM

TECHNICAL FIELD

The present invention relates to a method of manufacturing a glass film, which includes a step of forming a band-shaped glass film by pulling down a glass ribbon flowing down from a forming trough through use of roller pairs arranged in a plurality of stages along an up-and-down direction and a step of changing a conveyance direction of the band-shaped glass film conveyed in a vertical direction after the forming to a horizontal direction.

BACKGROUND ART

In recent years, a small thickness and a small weight are demanded for mobile terminals such as smartphones and tablet PCs which are rapidly spread. Thus, in the current condition, there is an increasing demand for reduction in thickness of glass substrates to be incorporated into those terminals. Under such current condition, a glass film which is a glass substrate reduced in thickness as small as that of a film (for example, thickness equal to or smaller than 300 μm) is now developed and manufactured.

Incidentally, steps of manufacturing a glass film generally include a step of manufacturing a band-shaped glass film that is a base of the glass film. For example, in Patent Literature 1, there is disclosed a method of manufacturing a band-shaped glass film through use of a down-draw method as represented by, for example, an overflow down-draw method, a re-draw method, and a slot down-draw method.

In the method disclosed in Patent Literature 1, first, a band-shaped glass film is formed by pulling down a glass ribbon flowing down from a forming trough through use of roller pairs arranged in a plurality of stages along an up-and-down direction. Then, as illustrated in FIG. 5, a band-shaped glass film 100 conveyed in a vertical direction after the forming is conveyed by a roller conveyor 101 along a conveyance path having an arc shape while being supported from a back surface 100a side, thereby changing the conveyance direction to a horizontal direction so that a front surface 100b of the band-shaped glass film 100 having passed through the conveyance path faces upward. Then, while the band-shaped glass film is conveyed in the horizontal direction, non-effective parts (parts which do not form a finished product and are to be discarded) including edge portions are cut and removed. Finally, a band-shaped glass film having the non-effective parts removed therefrom and including only an effective part (part which later forms a finished product) is wound up into a roll to be formed into a glass roll.

CITATION LIST

Patent Literature 1: JP 2010-132531 A

SUMMARY OF INVENTION

Technical Problem

However, in the method disclosed in Patent Literature 1, there arises the following problem due to flexibility of the band-shaped glass film having a small thickness.

Specifically, as illustrated in FIG. 5, when the conveyance direction is changed from the vertical direction to the horizontal direction, the band-shaped glass film 100 passing through the conveyance path is curved by its own weight so that the back surface 100a (surface which faces downward after having passed through the conveyance path) protrudes along a width direction. Meanwhile, there is a case in which the band-shaped glass film 100 being conveyed in the vertical direction (before the conveyance direction is changed) enters the conveyance path under a state in which the front surface 100b is curved so as to protrude along the width direction. In such case, along with passage through the conveyance path, the protruding curved surface of the band-shaped glass film 100 is rapidly shifted from the front surface 100b to the back surface 100a. When such shifting occurs, a wrinkle (flexure) having a large curvature is formed at a boundary portion 100c between the protruding curved part of the front surface 100b and the protruding curved part of the back surface 100a in the band-shaped glass film 100, and a stress which exceeds an allowable range acts on the boundary portion 100c, with the result that the band-shaped glass film 100 is broken in some cases. Therefore, in order to solve such problem, there has been desired establishment of a technology which is capable of preventing breakage of the band-shaped glass film at the time of changing the conveyance direction of the band-shaped glass film conveyed in the vertical direction after forming to the horizontal direction.

The present invention having been made in view of the circumstance described above has a technical object to prevent breakage of a band-shaped glass film at the time of changing a conveyance direction of the band-shaped glass film conveyed in a vertical direction after forming to a horizontal direction.

Solution to Problem

According to one embodiment of the present invention, which has been devised to achieve the above-mentioned object, there is provided a method of manufacturing a glass film, comprising the steps of: a forming a band-shaped glass film by pulling down a glass ribbon flowing down from a forming trough while sandwiching the glass ribbon from both front and back sides through use of roller pairs arranged in a plurality of stages along an up-and-down direction; and changing a conveyance direction of the band-shaped glass film conveyed in a vertical direction after the forming to a horizontal direction by conveying the band-shaped glass film along a conveyance path having an arc shape while supporting the band-shaped glass film from a back surface side through use of a conveyance means so that a front surface of the band-shaped glass film after having passed through the conveyance path faces upward, wherein an abutment member which is to be brought into abutment against the band-shaped glass film from the front surface side is arranged between a roller pair arranged in a lowermost stage and the conveyance means. Herein, the "conveyance path having an arc shape" includes not only a path having a constant curvature but also a path having a curvature which changes therealong. In the following description, the term "curve" corresponds to a curve along a width direction of the band-shaped glass film unless otherwise noted.

In this method, the abutment member which is to be brought into abutment against the band-shaped glass film from the front surface side is arranged between the roller pair arranged in the lowermost stage and the conveyance means, thereby being capable of preventing the front surface of the band-shaped glass film that enters the conveyance path from being curved so as to protrude. Under the state in which the front surface is prevented from being curved in a protruding manner, the band-shaped glass film enters the conveyance path. Thus, rapid shifting of the protruding curved surface of the band-shaped glass film from the front surface to the back surface along with passage through the conveyance path can be avoided. As a result, breakage of the band-shaped glass film can be prevented at the time of changing the conveyance direction of the band-shaped glass film conveyed in the vertical direction after forming to the horizontal direction.

In the method described above, it is preferred that the abutment member is a first roller having a rotation axis extending along a width direction of the band-shaped glass film.

With such configuration, through use of a roller as the abutment member, at the time of preventing the front surface of the band-shaped glass film that enters the conveyance path from being curved in a protruding manner, occurrence of a situation in which the front surface of the band-shaped glass film is undesirably damaged due to abutment against the abutment member can be avoided.

In the method described above, it is preferred that a position of the first roller be adjustable along a thickness direction of the band-shaped glass film conveyed in the vertical direction.

With such configuration, even when a passing position of the band-shaped glass film that enters the conveyance path is unavoidably shifted in the thickness direction, through adjustment of the position of the first roller, the first roller can reliably be brought into abutment against the front surface of the band-shaped glass film. Therefore, a fear in that the shift in passing position of the band-shaped glass film causes the first roller to be brought into a non-contact state with respect to the band-shaped glass film and thus leads to loss of the action of preventing the front surface from being curved in a protruding manner can be appropriately eliminated. Moreover, through the adjustment of the position of the first roller, pressure applied from the first roller to the band-shaped glass film can also be adjusted. With this, application of an excessive load on the band-shaped glass film by the first roller can be avoided.

In the method described above, it is preferred that a posture of the first roller be adjustable between a basic posture in which the rotation axis of the first roller is in a state of extending in parallel to a rotation axis of the roller pair and an inclined posture in which the rotation axis of the first roller is in a state of being inclined with respect to the rotation axis of the roller pair.

The band-shaped glass film usually enters the conveyance path under a state in which the front and back surfaces thereof are parallel to the rotation axis of each roller pair. However, there is a case in which forming conditions for the band-shaped glass film in the forming step are accidentally changed, and the band-shaped glass film enters the conveyance path under a state in which a posture thereof is inclined as compared to a normal state. Therefore, when the posture of the first roller can be adjusted between the basic posture and the inclined posture, even in a case in which the band-shaped glass film enters the conveyance path under the state in which a posture thereof is inclined, through adjustment of the posture of the first roller, the first roller can reliably be brought into abutment against the front surface of the band-shaped glass film.

In the method described above, it is preferred that the first roller be arranged below a height position at which the band-shaped glass film starts being curved along a longitudinal direction of the band-shaped glass film along with passage through the conveyance path.

With such configuration, immediately before the band-shaped glass film starts entering the conveyance path, the first roller can be brought into abutment against the front surface of the band-shaped glass film. With this, a fear in that the front surface of the band-shaped glass film is curved so as to protrude after passing through the first roller and before entering the conveyance path and the band-shaped glass film enters the conveyance path in this state can reliably be eliminated.

In the method described above, it is preferred that the first roller be arranged so as to be apart from a position below a lower end portion of the forming trough in the vertical direction toward the front surface side of the band-shaped glass film.

With such configuration, with regard to the band-shaped glass film that enters the conveyance path, the front surface thereof can be prevented from being curved in a protruding manner without hindering a smooth change in conveyance direction of the band-shaped glass film from the vertical direction to the horizontal direction.

In the method described above, it is preferred that the first roller comprise first rollers in pair which are arranged on one side and another side of the band-shaped glass film in the width direction, respectively.

With such configuration, a part of the band-shaped glass film which passes through a position between the first roller on one side and the first roller on another side is prevented from being brought into contact with the first rollers. Therefore, for example, a fear in that the band-shaped glass film is damaged due to contact is eliminated. With this, it is advantageous for improvement in quality of the band-shaped glass film and quality of a glass film to be manufactured based on the band-shaped glass film.

In the method described above, it is preferred that the first rollers in pair be arranged so as to be symmetrical over a center line of the band-shaped glass film in the width direction as a reference.

With such configuration, occurrence of a situation in which the conveyance direction of the band-shaped glass film is shifted in the width direction due to abutment against the first rollers in pair can be suppressed as much as possible. Thus, the band-shaped glass film can be conveyed in a stable state.

In the method described above, it is preferred that each of the first rollers in pair be arranged so as to be prevented from being brought into contact with an effective part, which is present in a center of the band-shaped glass film in the width direction, and edge portions, which are included in non-effective parts present on outer sides of the effective part in the width direction.

With such configuration, the first rollers in pair are prevented from being brought into contact with the effective part of the band-shaped glass film. Thus, it is advantageous for improvement in quality of the band-shaped glass film and a glass film manufactured based on the band-shaped glass film. Moreover, the first rollers are also prevented from being brought into contact with the edge portions included in the non-effective parts. Thus, the following effect can also be attained. The edge portions each have a thickness larger than that of a part of the non-effective parts excluding the edge portions (in the following, referred to as "non-effective parts other than the edge portions"). Thus, when the first rollers are arranged so as to be brought into contact with both the edge portions and the non-effective parts other than the edge portions, steps formed between the edge portions and the non-effective parts other than the edge portions form a portion which is not brought into contact with the first rollers in the non-effective parts other than the edge portions. Therefore, there is a fear in that the presence of the portion which is not brought into contact with the first rollers causes a disadvantage for preventing the front surface of the band-shaped glass film that enters the conveyance path from being curved in a protruding manner. However, when the first rollers are arranged so as to be prevented from being brought into contact with the edge portions, the first rollers can be brought into contact with only the non-effective parts other than the edge portions, thereby being capable of effectively preventing the front surface from being curved in a protruding manner.

In the method described above, it is preferred that second rollers which are to be brought into abutment against only the edge portions of the band-shaped glass film from the front surface side be arranged between the roller pair arranged in the lowermost stage and the conveyance means.

The band-shaped glass film being conveyed in the vertical direction is in a state of being liable to rock in the thickness direction. Therefore, when the first rollers are not brought into contact with the edge portions of the band-shaped glass film, the rocking of the band-shaped glass film cannot be sufficiently suppressed. Therefore, there is a fear in that conveyance of the band-shaped glass film in a stable state becomes more difficult. However, when the second rollers which are to be brought into abutment against only the edge portions of the band-shaped glass film from the front surface side are arranged, such fear can be appropriately eliminated.

Advantageous Effects of Invention

According to the present invention, it is possible to prevent breakage of the band-shaped glass film at the time of changing the conveyance direction of the band-shaped glass film conveyed in the vertical direction after the forming to the horizontal direction.

DESCRIPTION OF EMBODIMENTS

Now, with reference to the accompanying drawings, description is made of a method of manufacturing a glass film according to embodiments of the present invention. In the following description, the term "curve" corresponds to a curve along a width direction of a band-shaped glass film unless otherwise noted.

First Embodiment

First, description is made of a method of manufacturing a glass film according to a first embodiment of the present invention.

Figure 1:
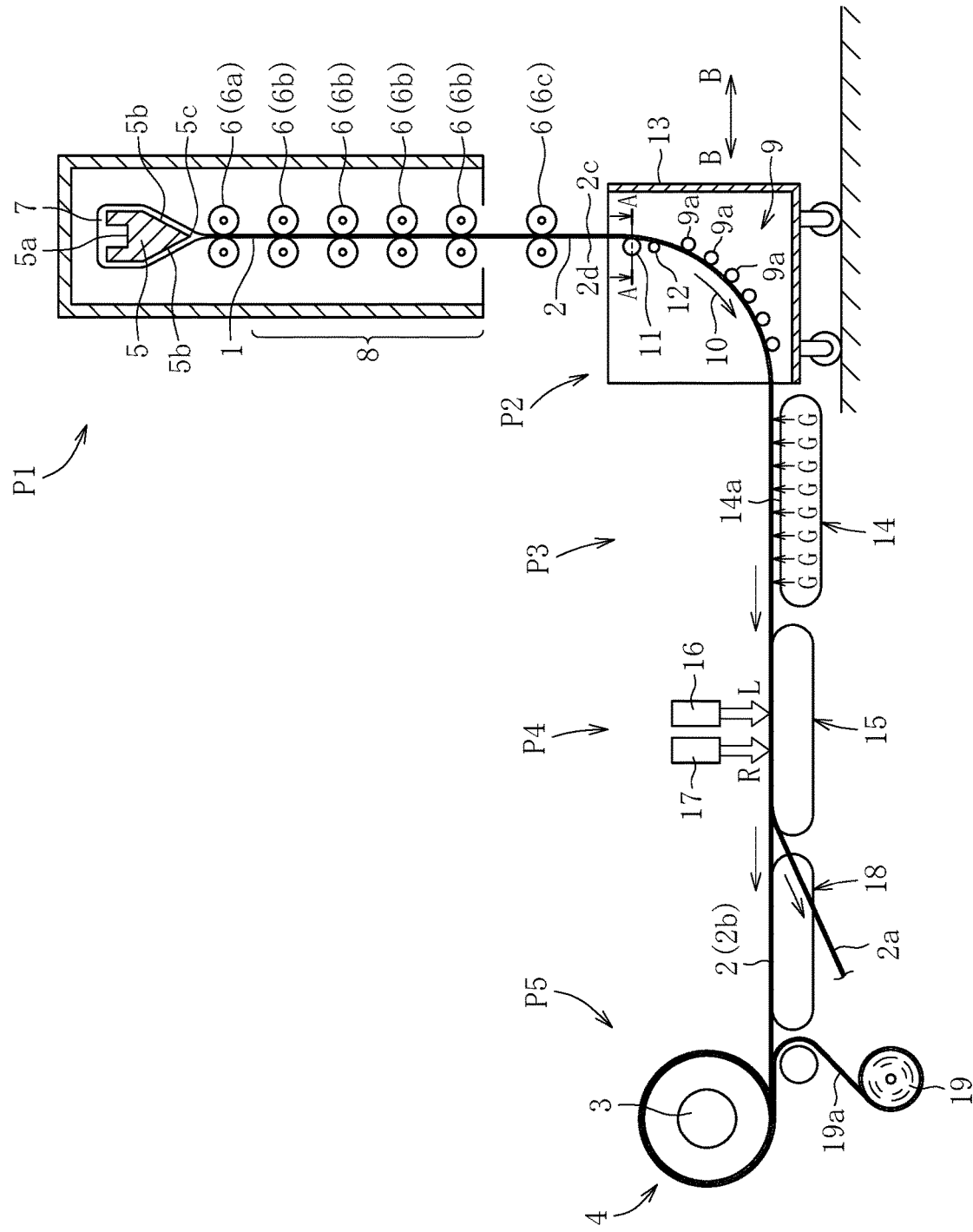
FIG. 1 is a partial vertical sectional side view for illustrating a method of manufacturing a glass film according to a first embodiment of the present invention.

As illustrated in FIG. 1, the method of manufacturing a glass film according to the first embodiment comprises a forming step P1, a conveyance direction changing step P2, a float-conveyance step P3, a cutting and removing step P4, and a winding step P5. In the forming step P1, a glass ribbon 1 is formed into a band-shaped glass film 2 using an overflow down-draw method. In the conveyance direction changing step P2, a conveyance direction of the band-shaped glass film 2 conveyed in a vertical direction after the forming is changed to a horizontal direction. In the float-conveyance step P3, the band-shaped glass film 2 having been changed in conveyance direction is conveyed under a state in which the band-shaped glass film 2 floats. In the cutting and removing step P4, while the band-shaped glass film 2 is conveyed in the horizontal direction, non-effective parts 2a are cut and removed from the band-shaped glass film 2. In the winding step P5, the band-shaped glass film 2 having the non-effective parts 2a removed therefrom and comprising only an effective part 2b is wound up into a roll around a winding core 3 to be formed into a glass roll 4.

[Forming Step]

For the forming step P1, there are mainly used a forming trough 5 and roller pairs 6. The forming trough 5 has a wedge shape. The roller pairs 6 are arranged in a plurality of stages along an up-and-down direction, and are capable of sandwiching, from both front and back sides, the glass ribbon 1 flowing down from the forming trough 5.

The forming trough 5 comprises an overflow groove 5a, a pair of side surface portions 5b and 5b, and a lower end portion 5c. The overflow groove 5a is formed in a top portion of the forming trough 5 for allowing a molten glass 7 to flow thereinto. The pair of side surface portions 5b and 5b are configured to allow the molten glass 7 having flowed out from the overflow groove 5a to both sides to flow down. The lower end portion 5c is configured to merge and integrate the molten glass 7 having flowed down along the side surface portions 5b and 5b. The forming trough 5 is capable of continuously producing the glass ribbon 1 from the molten glass 7 having merged and integrated at the lower end portion 5c.

The roller pairs 6 arranged in a plurality of stages along the up-and-down direction comprise a cooling roller pair 6a, annealer roller pairs 6b, and a support roller pair 6c in the state order from an upper stage. The roller pairs 6 are each capable of sandwiching parts of the glass ribbon 1 on one side and another side in a width direction of the glass ribbon 1, which are to be later formed into non-effective parts 2a of the band-shaped glass film 2.

The cooling roller pair 6a is a roller pair configured to suppress contraction of the glass ribbon 1 in the width direction by sandwiching the glass ribbon 1 directly below the forming trough 5. The annealer roller pairs 6b are each a roller pair configured to guide the glass ribbon 1 downward, which is to be annealed to a temperature equal to or less than a strain point in an annealing furnace 8. The annealer roller pairs 6b sandwich the glass ribbon 1 in some cases, or only restrict rocking of the glass ribbon 1 in the thickness direction without sandwiching the glass ribbon 1 in some cases. The support roller pair 6c is a roller pair which is configured to support the glass ribbon 1 having been reduced in temperature to a temperature close to a room temperature in a cooling chamber (not shown) arranged below the annealing furnace 8. Further, the support roller pair 6c is configured to determine a speed of pulling down the glass ribbon 1 (drawing speed).

The glass ribbon 1 having passed through the roller pairs 6 which are arranged in a plurality of stages along the up-and-down direction is formed into the band-shaped glass film 2. The band-shaped glass film 2 is formed so as to have a thickness which is sufficient to give flexibility to the band-shaped glass film 2. For example, the band-shaped glass film 2 is formed so as to have a thickness equal to or smaller than 300 µm. The band-shaped glass film 2 comprises the effective part 2b and the pair of non-effective parts 2a. The effective part 2b is present at a center in the width direction (direction perpendicular to the drawing sheet of FIG. 1) and later forms a finished product. The pair of non-effective parts 2a are present on outer sides of the effective part 2b in the width direction and are to be removed. Further, in the non-effective parts 2a, at parts positioned at end portions of the band-shaped glass film 2 in the width direction, there are formed edge portions 2aa each having a thickness larger than those of other parts.

In this embodiment, the band-shaped glass film 2 is formed through use of the overflow down-draw method. However, as a matter of course, the band-shaped glass film 2 may be formed through use of, for example, a slot down-draw method or a re-draw method.

[Conveyance Direction Changing Step]

For the conveyance direction changing step P2, a roller conveyor 9 serving as a conveyance means is used. The roller conveyor 9 is formed of a plurality of rollers 9a arranged in parallel with each other. The roller conveyor 9 conveys the band-shaped glass film 2 along a conveyance path 10 having an arc shape while supporting the band-shaped glass film 2 from a back surface 2c side, to thereby change the conveyance direction so that a front surface 2d of the band-shaped glass film 2 having passed through the conveyance path 10 faces upward. When the conveyance direction changing step P2 is to be performed, first rollers 11 (abutment member) each having a rotation axis 11a extending along the width direction are brought into abutment, from the front surface 2d side, against the band-shaped glass film 2 which enters the conveyance path 10.

The first rollers 11 are arranged between the above-mentioned support roller pair 6c and the roller conveyor 9. A height position at which the first rollers 11 are arranged is below a height position at which the band-shaped glass film 2 starts being curved along a longitudinal direction of the band-shaped glass film 2 along with passage through the conveyance path 10. Moreover, the first rollers 11 are arranged at positions apart from a position below the lower end portion 5c of the forming trough 5 in the vertical direction toward the front surface 2d side of the band-shaped glass film 2 (those positions are hereinafter referred to as "initial positions P"). Further, second rollers 12 which are to be brought into abutment against only the edge portions 2aa of the band-shaped glass film 2 from the front surface 2d side are arranged between the first rollers 11 and the roller conveyor 9. Similarly to the first rollers 11, the second rollers 12 each have a rotation axis 12a extending along the width direction of the band-shaped glass film 2. A diameter of each of the second rollers 12 is smaller than a diameter of each of the first rollers 11.

As the first rollers 11 and the second rollers 12, there may be used free rollers or driving rollers. However, when the driving rollers are to be used, it is preferred that the driving rollers be driven at a torque which does not cause the band-shaped glass film 2 to be pulled down in the longitudinal direction by the driving rollers. Moreover, it is preferred that the first rollers 11 and the second rollers 12 be brought into abutment against the band-shaped glass film 2 with application of a pressure which does not cause local deformation of the band-shaped glass film 2 caused by the abutment against the rollers 11 and 12.

The first rollers 11, the second rollers 12, and the roller conveyor 9 are assembled to a housing 13. The housing 13 is movable along an arrow B-B direction (thickness direction of the band-shaped glass film 2 conveyed in the vertical direction). With this, the first rollers 11, the second rollers 12, and the roller conveyor 9 are movable along with the movement of the housing 13 while maintaining a relative positional relationship thereof. Therefore, for example, during a period of not manufacturing the band-shaped glass film 2, when the first rollers 11, the second rollers 12, and the roller conveyor 9 are to be retreated from the conveyance passage of the band-shaped glass film 2 for inspection or the like, the first rollers 11, the second rollers 12, and the roller conveyor 9 can be collectively retreated. It is preferred that the first rollers 11 and the second rollers 12 be movable to positions of not interfering with the band-shaped glass film 2 at the time of retreating from the conveyance passage. With such configuration, occurrence of a situation in which the band-shaped glass film 2 is cracked due to interference with the first rollers 11 or the second rollers 12 being retreated can be avoided. As a matter of course, the housing 13 may be omitted so that the first rollers 11, the second rollers 12, and the roller conveyor 9 move independently.

Figure 2:
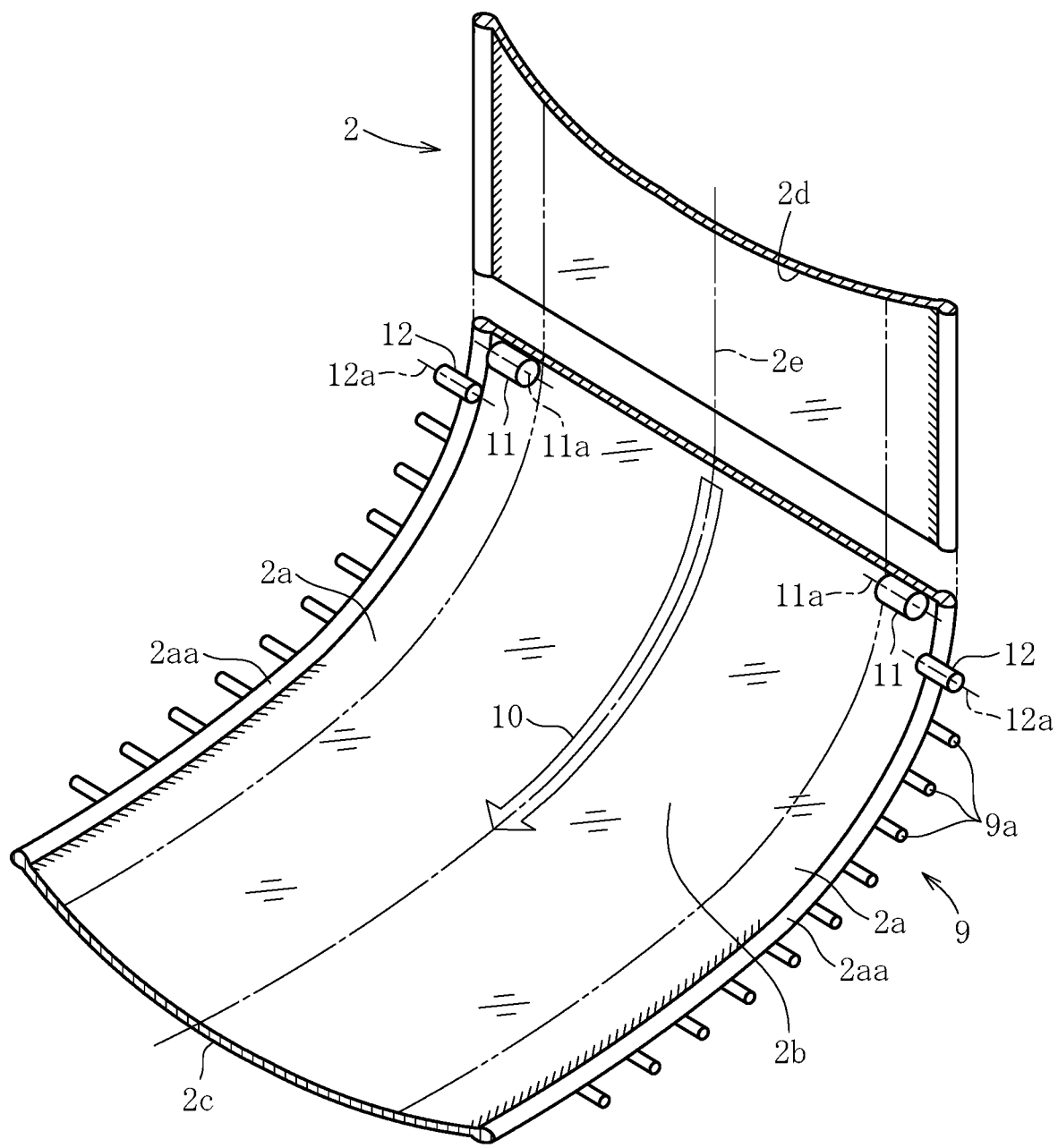
FIG. 2 is a perspective view for illustrating the method of manufacturing a glass film according to the first embodiment of the present invention.

As illustrated in FIG. 2, the first rollers 11 and the second rollers 12 are arranged so as to form pairs on one side and another side in the width direction of the band-shaped glass film 2. The first rollers 11 in pair are arranged so as to be symmetrical over a center line 2e of the band-shaped glass film 2 in the width direction as a reference. The second rollers 12 in pair are arranged so as to be symmetrical over the center line 2e of the band-shaped glass film 2 in the width direction as a reference. Further, the first rollers 11 in pair are arranged so as to be held in non-contact with the effective part 2b and the edge portions 2aa of the band-shaped glass film 2.

Figure 3A:
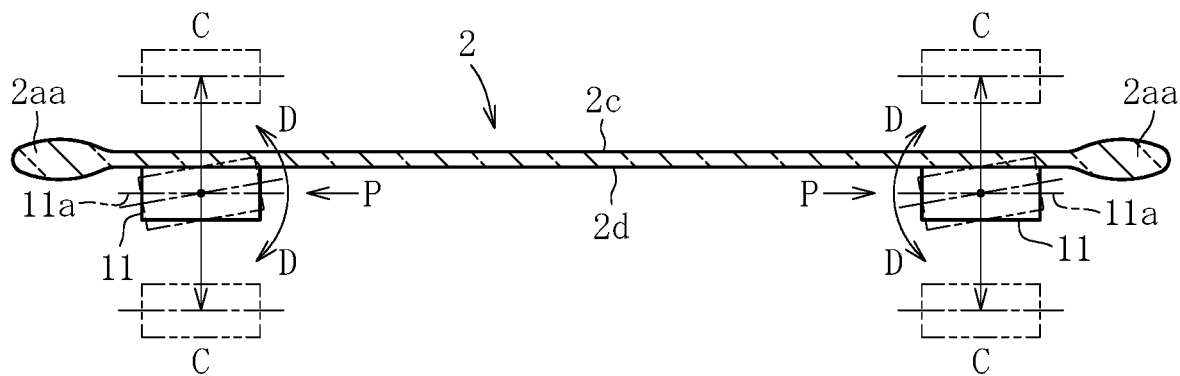
FIG. 3a is a sectional view for illustrating a cross section taken along the line A-A in FIG. 1.

As illustrated in FIG. 3a, with the initial positions P as a reference, the first rollers 11 are movable along an arrow C-C direction (thickness direction of the band-shaped glass film 2 conveyed in the vertical direction), and positions thereof are adjustable. Further, as indicated by arrows D-D, postures of the first rollers 11 are adjustable between a basic posture and an inclined posture. In the basic posture, the rotation axis 11a is in a state of extending in parallel to rotation axes of the support roller pair 6c described above. In the inclined posture, the rotation axis 11a is in a state of being inclined with respect to the rotation axes of the support roller pair 6c (in a state of being inclined in the same horizontal plane with respect to the rotation axis 11a in the basic posture).

Figure 3B:
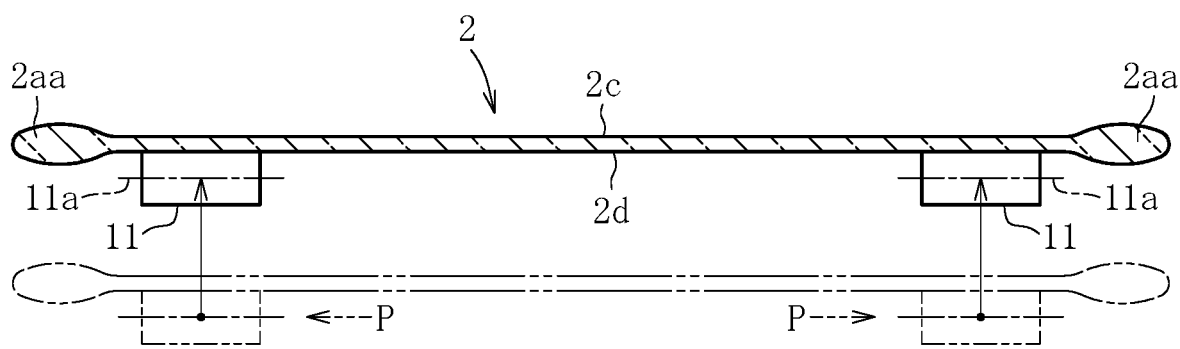
FIG. 3b is a sectional view for illustrating the cross section taken along the line A-A in FIG. 1.
Figure 3C:
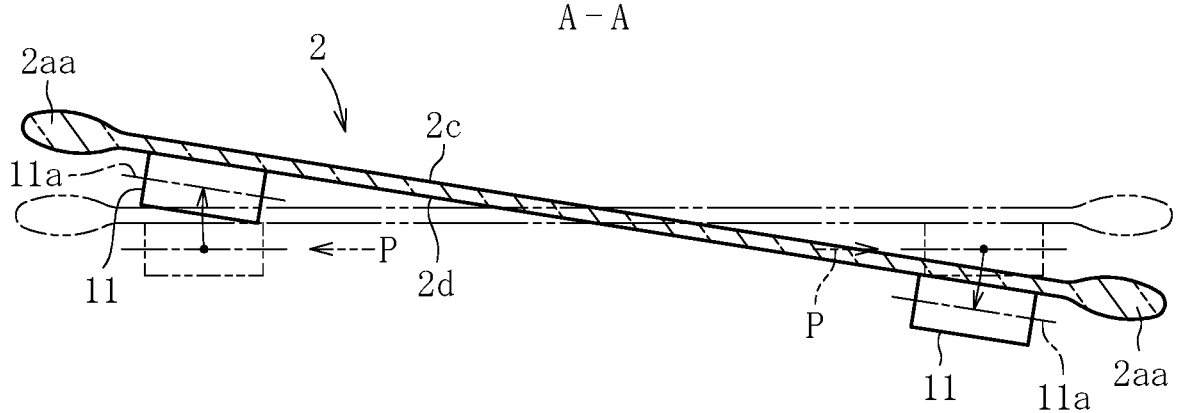
FIG. 3c is a sectional view for illustrating the cross section taken along the line A-A in FIG. 1.

The positions and the postures of the first rollers 11 are adjustable. Therefore, as illustrated in FIG. 3b, even when a passing position of the band-shaped glass film 2 that enters the conveyance path 10 is unavoidably shifted in the thickness direction, through adjustment of the positions, the first rollers 11 can be brought into abutment against the front surface 2d of the band-shaped glass film 2. Moreover, as illustrated in FIG. 3c, even when the band-shaped glass film 2 is brought into a state in which a posture thereof is inclined as compared to the normal state, through adjustment of the positions and the postures, the first rollers 11 can be brought into abutment against the front surface 2d of the band-shaped glass film 2.

The adjustment of the positions and the postures of the first rollers 11 may be performed through a manual operation by a user or may be performed through use of a control mechanism configured to control positions and postures of the first rollers 11. For example, when the adjustment is to be performed through the manual operation, the manual operation may be performed through an operation of a handle connected to an adjustment mechanism configured to adjust positions and postures of the first rollers 11. Moreover, when the control mechanism is to be used, control may be performed in the following manner. Specifically, the shift of the passing position of the band-shaped glass film 2 in the thickness direction or a change in posture of the band-shaped glass film 2 is detected through use of a detector (for example, various sensors), and the positions and the postures of the first rollers 11 are controlled based on a detection result of the detector. Positions and postures of the second rollers 12 can be adjusted in a manner similar to that for the first rollers 11.

When the first rollers 11 are arranged so as to be brought into abutment against, from the front surface 2d side, the band-shaped glass film 2 that enters the conveyance path, the following effects can be attained.

As illustrated in FIG. 2, the band-shaped glass film 2 passing through the conveyance path 10 is curved by its own weight so that the back surface 2c is curved so as to protrude. Meanwhile, there is a case in which the band-shaped glass film 2 being conveyed in the vertical direction enters the conveyance path 10 under a state in which the front surface 2d is curved so as to protrude. In such case, when the first rollers 11 are not arranged, the band-shaped glass film 2 may be broken due to rapid shifting of the protruding curved surface of the band-shaped glass film 2 from the front surface 2d to the back surface 2c along with passage through the conveyance path 10.

However, through the arrangement of the first rollers 11, the abutment against the first rollers 11 prevents the front surface 2d of the band-shaped glass film 2, which enters the conveyance path 10, from being curved so as to protrude. With this, under the state in which the front surface 2d is prevented from being curved in a protruding manner, the band-shaped glass film 2 enters the conveyance path 10. Therefore, occurrence of the situation in which the protruding curved surface of the band-shaped glass film 2 is shifted along with passage through the conveyance path 10 is avoided. In other words, when observed from a direction parallel to the width direction of the band-shaped glass film 2, there is no inflection point in a curve of the band-shaped glass film 2 from a start to an end of changing the conveyance direction from the vertical direction to the horizontal direction, the inflection point being a point where curvatures of the front surface 2d and the back surface 2c of the band-shaped glass film 2 in the width direction are exchanged between concave and convex or convex and concave. As a result, the breakage of the band-shaped glass film 2 can be prevented at the time of changing the conveyance direction of the band-shaped glass film 2 from the vertical direction to the horizontal direction.

[Float-Conveyance Step]

As illustrated in FIG. 1, for the float-conveyance step P3, there is used a belt conveyor 14 capable of jetting a gas G (for example, air) with respect to the back surface 2c of the band-shaped glass film 2 conveyed in the horizontal direction. With this belt conveyor 14, the band-shaped glass film 2 is conveyed under a state in which only a center thereof in the width direction (mainly the effective part 2b) floats.

The belt conveyor 14 comprises a belt 14a and a gas jetting device (not shown). The belt 14a has an endless shape, and is configured to convey non-floating portions (mainly the non-effective parts 2a) of the band-shaped glass film 2. The gas jetting device is arranged on an inner peripheral side of the belt 14a, and is configured to jet a gas G upward. The belt 14a has a large number of fine through holes (not shown), and the gas G having been jetted from the gas jetting device passes through the through holes to reach the back surface 2c of the band-shaped glass film 2. The gas jetting device arranged on the inner peripheral side of the belt 14a is arranged along the center of the belt 14a in the width direction.

[Cutting and Removing Step]

In the cutting and removing step P4, through use of a laser cutting method, the non-effective parts 2a are cut and removed from the band-shaped glass film 2. For the cutting and removing step P4, there are used a laser irradiator 16 and a refrigerant jetting device 17. The laser irradiator 16 is installed so as to be fixed at a certain point above the belt conveyor 15. The laser irradiator 16 is configured to continuously irradiate the band-shaped glass film 2 passing therebelow with a laser light L along a boundary between each of the non-effective parts 2a and the effective part 2b of the band-shaped glass film 2. The refrigerant jetting device 17 is configured to continuously jet a refrigerant R (for example, mist-like water) with respect to the part of the band-shaped glass film 2 having been irradiated with the laser light L.

With this, a thermal stress is generated in the band-shaped glass film 2 due to a temperature difference between the part having been heated by the laser light L and the part having been cooled by the refrigerant R. Further, due to the thermal stress, a cut part (part at which the effective part 2b and the non-effective part 2a are separated from each other) is continuously formed along the boundary between the effective part 2b and the non-effective part 2a. In such manner, the band-shaped glass film 2 is continuously cut along the longitudinal direction.

The band-shaped glass film 2 having the non-effective parts 2a cut and removed therefrom (band-shaped glass film 2 comprising only the effective part 2b) is moved from the belt conveyor 15 to a belt conveyor 18. Meanwhile, the non-effective parts 2a having been removed from the band-shaped glass film 2 are not moved to the belt conveyor 18. The non-effective parts 2a are separated downward from the conveyance passage for the band-shaped glass film 2, and are thereafter discarded.

[Winding Step]

For the winding step, there are mainly used the winding core 3 and a sheet roll 19. In the winding step P5, the band-shaped glass film 2 having been conveyed from the belt conveyor 18 is superposed on a protection sheet 19a that is continuously fed out from the sheet roll 19. After that, the band-shaped glass film 2 is wound up into a roll around the winding core 3 to be formed into the glass roll 4. With this, all of the steps of the method of manufacturing a glass film according to this embodiment are completed.

Second Embodiment

Now, description is made of a method of manufacturing a glass film according to a second embodiment of the present invention. In the description of the second embodiment, components which are already described in the above-mentioned first embodiment are denoted by the same reference symbols in the drawings referred to in the description of the second embodiment. Thus, redundant description thereof is omitted, and only differences from the first embodiment are described.

Figure 4:
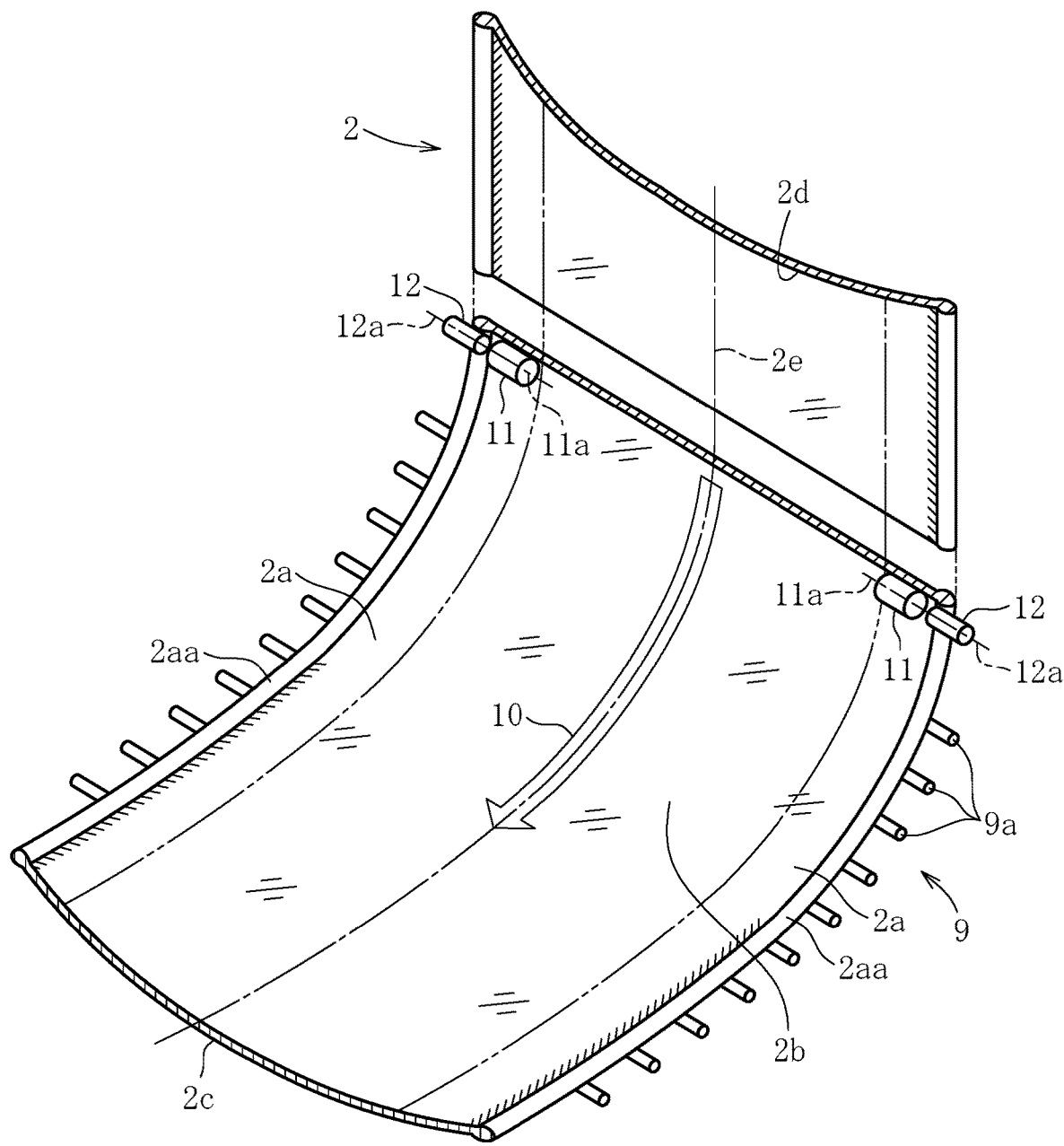
FIG. 4 is a perspective view for illustrating a method of manufacturing a glass film according to a second embodiment of the present invention.
Figure 5:
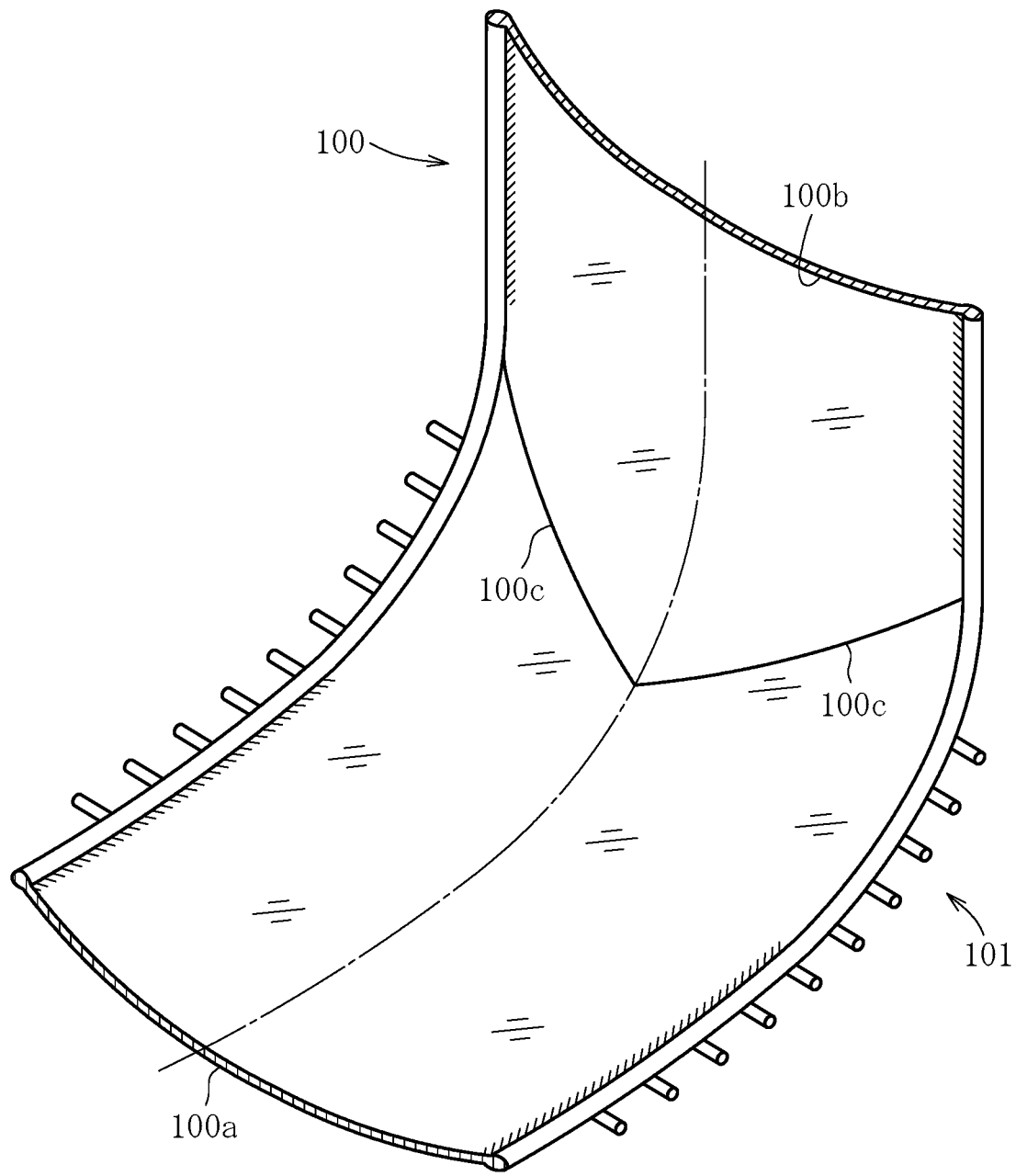
FIG. 5 is an explanatory perspective view for illustrating a problem in the related art.

As illustrated in FIG. 4, the method of manufacturing a glass film according to the second embodiment is different from that of the first embodiment in arrangement of the second rollers 12.

The second rollers 12 are arranged at the same height position as that of the first rollers 11 on outer sides of the first rollers 11 in the width direction of the band-shaped glass film 2, and the rotation axes 12a of the second rollers 12 are positioned on extension lines of the rotation axes 11a of the first rollers 11. The rollers 11 and 12 are rotatable independently of one another. Moreover, the difference in size of a diameter between the first rollers 11 and the second rollers 12 is approximately equal to the difference in thickness between the edge portions 2aa and a part other than the edge portions 2aa in the band-shaped glass film 2.

The method of manufacturing a glass film according to the present invention is not limited to the modes described in the above-mentioned embodiments. For example, in the above-mentioned embodiments, the first rollers are arranged below the height position at which the band-shaped glass film starts being curved along the longitudinal direction thereof along with passage through the conveyance path. However, the first rollers may be arranged at the height position at which the band-shaped glass film starts being curved, or may be arranged above the height position at which the band-shaped glass film starts being curved.

Moreover, the second rollers are arranged below the first rollers in the above-mentioned first embodiment, and are arranged at the same height position as that of the first rollers in the above-mentioned second embodiment. However, the second rollers may be arranged above the first rollers. Moreover, only the first rollers may be used without use of the second rollers.

Moreover, in the above-mentioned embodiments, the first rollers are used as the abutment member. However, the abutment member is not limited to the first rollers. Any other member which is capable of being brought into abutment against the front surface of the band-shaped glass film without causing damage on the front surface may be used as the abutment member.

Moreover, in the above-mentioned embodiments, the laser cutting method is used in the cutting and removing step. However, the cutting and removing step is not limited to the use of the laser cutting method. In place of the laser cutting method, there may be adopted a laser fusing method, or a so-called "peeling method" of simultaneously performing laser fusion and removal of an end portion formed along with the fusion as a string-shaped object to be peeled off.

REFERENCE SIGNS LIST 1 glass ribbon
2 band-shaped glass film
2a non-effective part
2aa edge portion
2b effective part
2c back surface
2d front surface
2e center line
5 forming trough
5c lower end portion
6 roller pair
6a cooling roller pair
6b annealer roller pair
6c support roller pair
9 roller conveyor
10 conveyance path
11 first roller (abutment member)
11a rotation axis
12 second roller
P1 forming step
P2 conveyance direction changing step

The invention claimed is:

1. A method of manufacturing a glass film, the method comprising the steps of:
   forming a band-shaped glass film by pulling down a glass ribbon flowing down from a forming trough while sandwiching the glass ribbon from both front and back sides through use of roller pairs arranged in a plurality of stages along an up-and-down direction, the band-shaped glass film having edge portions at both ends in a width direction with thicknesses that are larger than other portions of the band-shaped glass film; and
   changing a conveyance direction of the band-shaped glass film conveyed in a vertical direction after the forming to a horizontal direction by conveying the band-shaped glass film along a conveyance path having an arc shape while supporting the band-shaped glass film from a back surface side through use of a conveyor so that a front surface of the band-shaped glass film after having passed through the conveyance path faces upward,
   wherein in a conveyance passage of the band-shaped glass film, a first roller, which is to be brought into abutment against only an area of the band-shaped glass film inside the edge portions in the width direction of the band-shaped glass film from a front surface side, is arranged in a section located between a roller pair arranged in a lowermost stage and the conveyor,
   wherein the first roller has a rotation axis extending along the width direction of the band-shaped glass film,
   wherein at a position where the first roller is arranged, the band-shaped glass film is not supported from the back surface side,
   wherein the conveyor is arranged along a curve of the conveyance path,
   wherein, when observed from a direction parallel to the width direction of the band-shaped glass film,
   curvatures of the front and back surfaces of the band-shaped glass film in the conveyance direction are not exchanged between concave and convex or convex and concave from a start to an end of the changing of the conveyance direction from the vertical direction to the horizontal direction.

2. The method of manufacturing a glass film according to claim 1, wherein a position of the first roller is adjustable along a thickness direction of the band-shaped glass film conveyed in the vertical direction.

3. The method of manufacturing a glass film according to claim 1, wherein a posture of the first roller is adjustable between an initial posture in which the rotation axis of the first roller extends in parallel to a rotation axis of the roller pair arranged in the lowermost stage and an inclined posture in which the rotation axis of the first roller is inclined with respect to the rotation axis of the roller pair arranged in the lowermost stage.

4. The method of manufacturing a glass film according to claim 1, wherein the first roller is arranged so as to be apart from a position below a lower end portion of the forming trough in the vertical direction toward the front surface side of the band-shaped glass film.

5. The method of manufacturing a glass film according to claim 1, wherein the first roller comprises first rollers in pair which are arranged on one side and another side of the band-shaped glass film in the width direction, respectively.

6. The method of manufacturing a glass film according to claim 5, wherein the first rollers in pair are arranged so as to be symmetrical over a center line of the band-shaped glass film in the width direction as a reference.

7. The method of manufacturing a glass film according to claim 5, wherein each of the first rollers in pair is arranged so as to be prevented from being brought into contact with an effective part, which is present in a center of the band-shaped glass film in the width direction, and the edge portions, which are included in non-effective parts present on outer sides of the effective part in the width direction.

8. The method of manufacturing a glass film according to claim 7, wherein second rollers which are to be brought into abutment against only the edge portions of the band-shaped glass film from the front surface side are arranged between the roller pair arranged in the lowermost stage and the conveyor.

* * * * *